(12) United States Patent
Kawakami et al.

(10) Patent No.: US 12,046,455 B2
(45) Date of Patent: Jul. 23, 2024

(54) SHOWER PLATE, LOWER DIELECTRIC MEMBER AND PLASMA PROCESSING APPARATUS

(71) Applicant: TOKYO ELECTRON LIMITED, Tokyo (JP)

(72) Inventors: Satoru Kawakami, Nirasaki (JP); Atsushi Kubo, Nirasaki (JP); Taro Ikeda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 733 days.

(21) Appl. No.: 16/984,778

(22) Filed: Aug. 4, 2020

(65) Prior Publication Data
US 2021/0043426 A1 Feb. 11, 2021

(30) Foreign Application Priority Data
Aug. 8, 2019 (JP) .................. 2019-146595

(51) Int. Cl.
| | | |
|---|---|---|
| C23C 16/00 | (2006.01) | |
| H01J 37/32 | (2006.01) | |
| H01L 21/00 | (2006.01) | |
| H01L 21/67 | (2006.01) | |

(52) U.S. Cl.
CPC .. *H01J 37/32449* (2013.01); *H01J 37/32082* (2013.01); *H01J 37/32541* (2013.01); *H01J 37/3255* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 8,261,691 B2* | 9/2012 | Yamazawa | ........ | H01J 37/32366 156/345.47 |
| 2005/0241583 A1* | 11/2005 | Buechel | ............ | H01J 37/32541 118/723 E |
| 2005/0276928 A1* | 12/2005 | Okumura | ............ | H01L 21/3065 427/446 |
| 2011/0226421 A1* | 9/2011 | Hayashi | ............ | H01J 37/32541 156/345.43 |
| 2012/0073755 A1* | 3/2012 | Hayashi | .............. | H01J 37/3244 156/345.34 |

FOREIGN PATENT DOCUMENTS

| | | |
|---|---|---|
| JP | 2007-515056 A | 6/2007 |
| JP | 2012-256604 A | 12/2012 |
| KR | 10-1741062 B1 | 5/2017 |
| WO | WO 2005/047564 A2 | 5/2005 |

* cited by examiner

*Primary Examiner* — Sylvia MacArthur
*Assistant Examiner* — Michelle Crowell
(74) *Attorney, Agent, or Firm* — Fenwick & West LLP

(57) ABSTRACT

A shower plate includes a plate-shaped dielectric main body having gas holes, and a plurality of sealed areas formed in the dielectric main body. Each of the sealed areas has a permittivity lower than a permittivity of the dielectric main body. A volume density of the sealed areas at a central region of the dielectric main body is higher than a volume density of the sealed areas at a peripheral region of the dielectric main body.

9 Claims, 14 Drawing Sheets

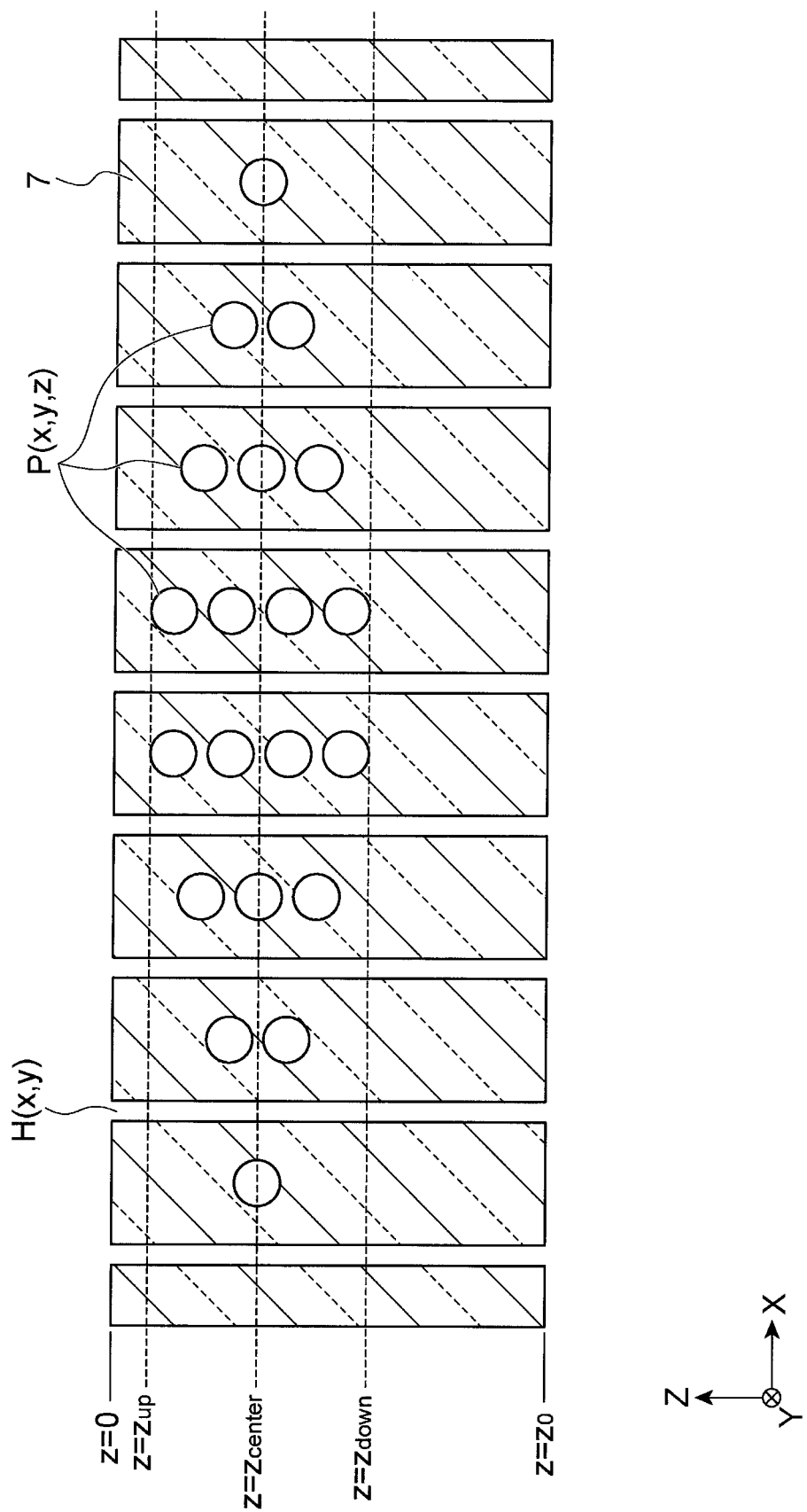

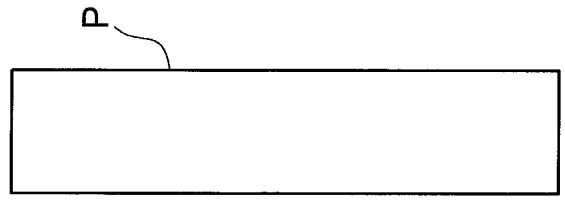
FIG.6C
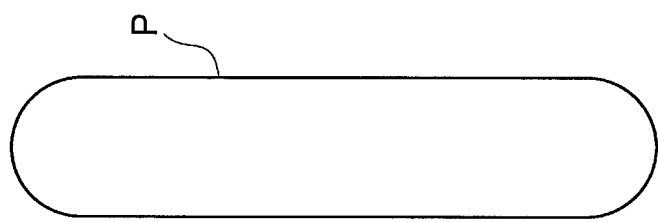
FIG.6B
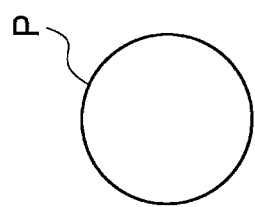
FIG.6A
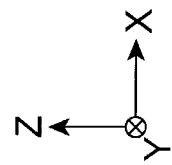

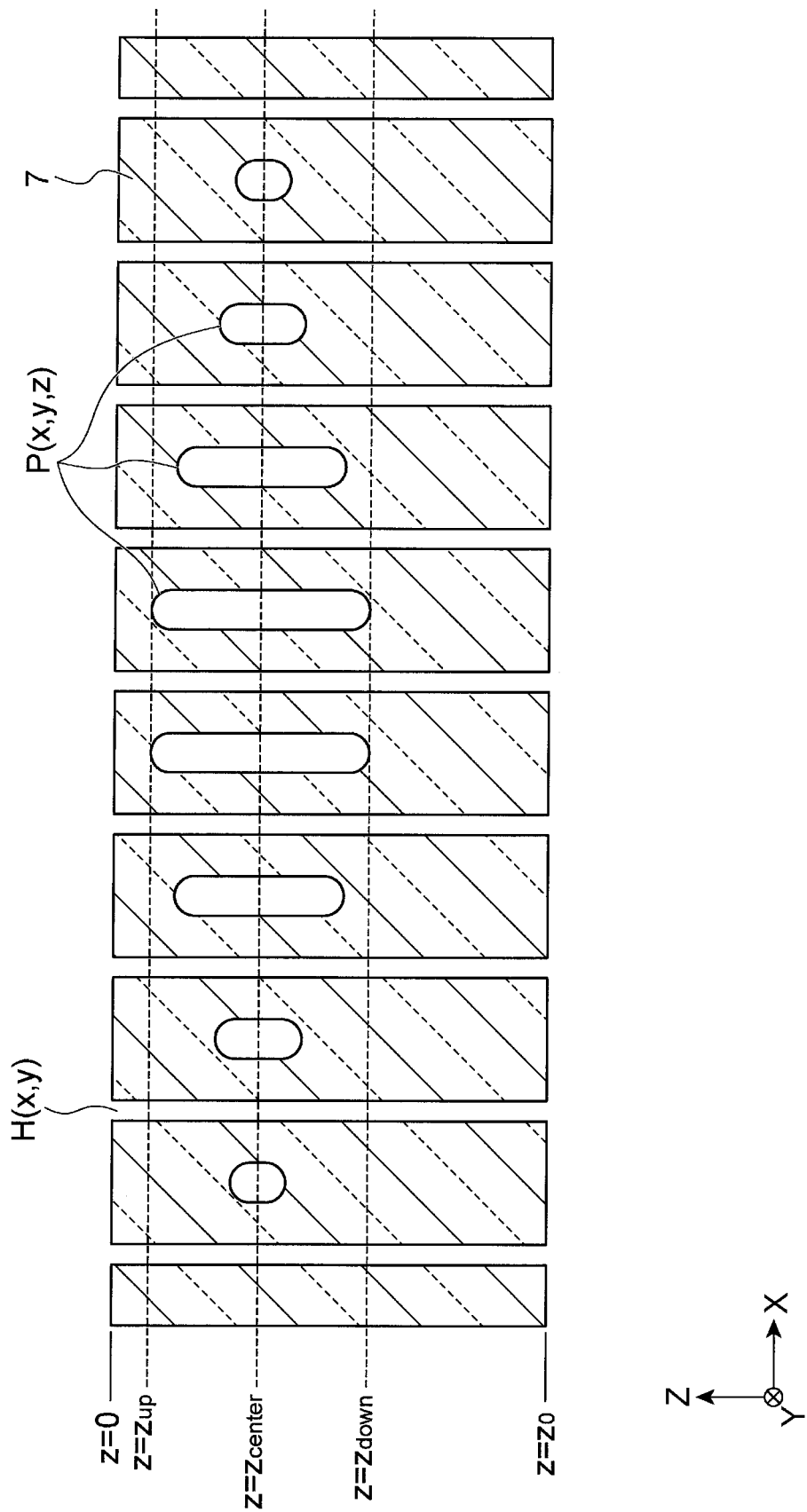

SHOWER PLATE, LOWER DIELECTRIC MEMBER AND PLASMA PROCESSING APPARATUS

CROSS-REFERENCE TO RELATED APPLICATION

This application claims priority to Japanese Patent Application No. 2019-146595, filed on Aug. 8, 2019, the entire contents of which are incorporated herein by reference.

TECHNICAL FIELD

The present disclosure relates to a shower plate, a lower dielectric member, and a plasma processing apparatus.

BACKGROUND

A conventional plasma processing apparatus using a shower plate is disclosed in Japanese Patent Application Publication No. 2012-256604. The shower plate disclosed in Japanese Patent Application Publication No. 2012-256604 has a shape in which a thickness of a central region is greater than that of a peripheral region.

The present disclosure provides a shower plate, a lower dielectric member, and a plasma processing apparatus capable of improving in-plane uniformity of plasma.

SUMMARY

In accordance with an aspect of the present disclosure, there is provided a shower plate including: a plate-shaped dielectric main body having gas holes; and a plurality of sealed areas formed in the dielectric main body. Further, each of the sealed areas has a permittivity lower than a permittivity of the dielectric main body, and a volume density of the sealed areas at a central region of the dielectric main body is higher than a volume density of the sealed areas at a peripheral region of the dielectric main body.

BRIEF DESCRIPTION OF THE DRAWINGS

The objects and features of the present disclosure will become apparent from the following description of embodiments, given in conjunction with the accompanying drawings, in which:

FIG. 4 shows a vertical cross-sectional structure of a dielectric main body of the shower plate;

FIGS. 6A to 6C show vertical cross-sectional shapes (shapes on the an XZ plane) of the sealed area;

FIGS. 7 to 11 show vertical cross-sectional structures of other examples of the dielectric main body of the shower plate;

DETAILED DESCRIPTION

Figure 1:
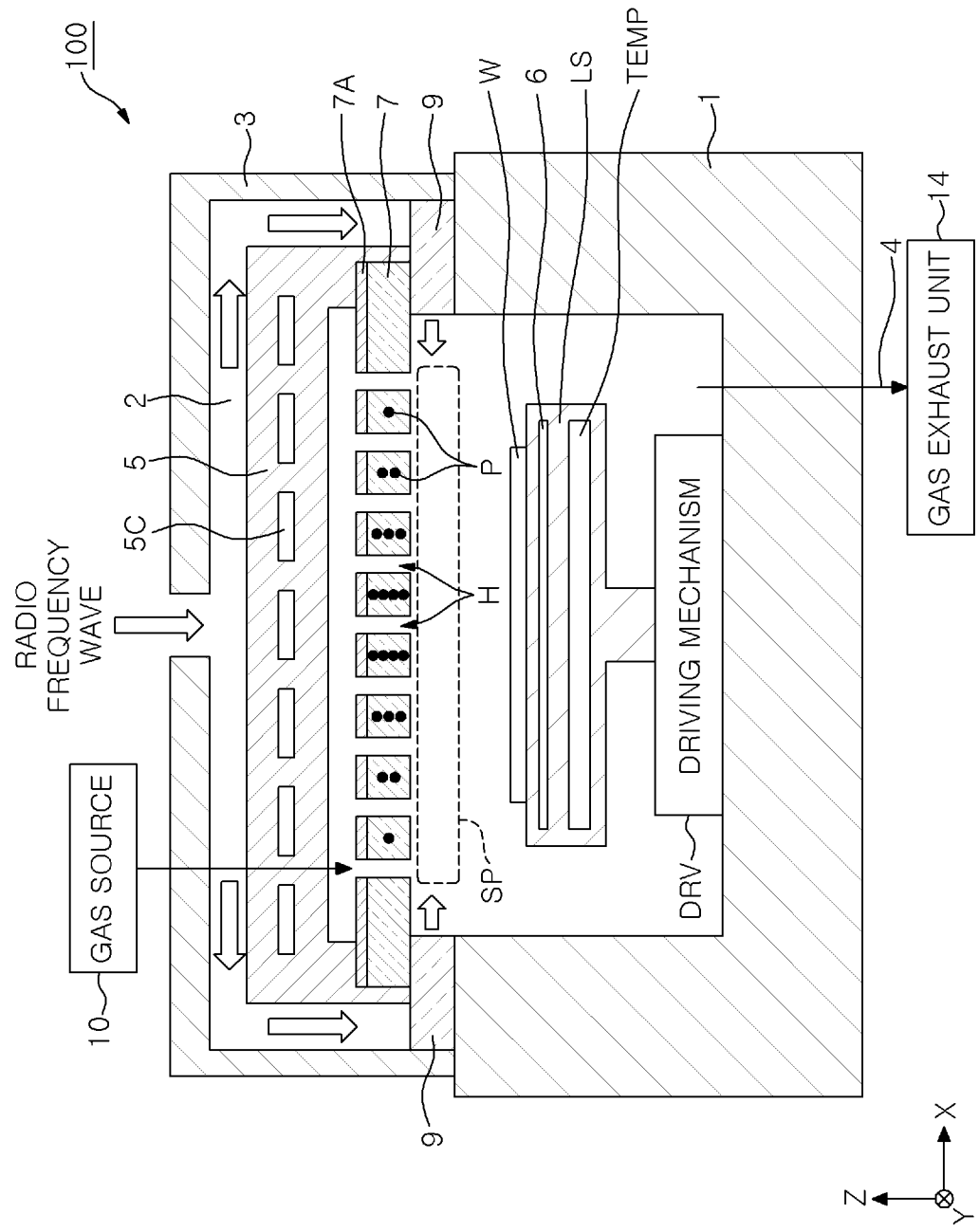
FIG. 1 shows a configuration of a plasma processing apparatus.

Hereinafter, various exemplary embodiments will be described.

In one exemplary embodiment, a shower plate includes a plate-shaped dielectric main body having gas holes; and a plurality of sealed areas formed in the dielectric main body. Each of the sealed areas has a permittivity lower than a permittivity of the dielectric main body, and a volume density of the sealed areas at a central region of the dielectric main body is higher than a volume density of the sealed areas at a peripheral region of the dielectric main body.

The electrostatic capacitance of the dielectric member is decreased as an effective permittivity is decreased. In the central region of the dielectric main body, the volume density of the sealed areas each having a relatively low permittivity is high, so that the effective permittivity is decreased. Therefore, the electrostatic capacitance of the central region is smaller than that of the peripheral region. When plasma is generated by introducing a radio frequency wave from a position above a shower plate or from a vicinity of the shower plate (e.g., from near the side of the shower plate), a plasma intensity tends to be higher in the central region. Since, however, the electrostatic capacitance of the central region is smaller than that of the peripheral region, the increase in the plasma intensity is suppressed and the in-plane uniformity of the plasma is improved.

In one exemplary embodiment, the shower plate may further include an electrode film. Further, the plate-shaped dielectric main body may have one flat surface and the other flat surface, and the electrode film may be fixed onto the one flat surface and the other flat surface may face a plasma generation region. Since the electrode film is fixed onto the dielectric main body, the gap therebetween is not affected by a temperature and discharge is unlikely to occur in the gap. Further, since both surfaces of the dielectric main body are flat, the distortion of the dielectric main body due to thermal expansion is suppressed. Therefore, the electrostatic capacitance of the shower plate is unlikely to change depending on a temperature, and thus the deterioration of plasma uniformity due to the temperature change is suppressed.

In one exemplary embodiment, the electrode film may be a thermally-sprayed metal film. The thermally-sprayed metal film has a high adhesive strength and is not easily peeled off. Therefore, discharge due to peeling off is unlikely to occur, and deterioration of the plasma uniformity is suppressed. Further, since the electrode film can be thermally sprayed on the flat surface of the dielectric main body, the spraying accuracy does not deteriorate compared to the case of spraying the electrode film on an uneven surface.

In one exemplary embodiment, each of the sealed areas may contain at least one gas selected from a group consisting of nitrogen gas and argon gas. It is preferable to use a material that does not affect plasma characteristics even when the dielectric material of the sealed area is exposed to the outside during the formation or the processing of the gas holes. Nitrogen gas and argon gas have a high degree of inactivity and are unlikely to cause contamination. Therefore, higher quality plasma can be generated in the case of using these materials. Further, nitrogen gas and argon gas have thermal expansion coefficients lower than that of air, so that it is possible to suppress a change in the electrostatic capacitance due to a temperature change.

In one exemplary embodiment, each of the sealed areas may have a shape extending along a thickness direction of the dielectric main body.

The electrostatic capacitance in the thickness direction of the shower plate is decreased in the central region. When the sealed area having a low permittivity extends along the thickness direction (longitudinal direction), the electrostatic capacitance between the upper surface and the bottom surface of the shower plate can be sufficiently reduced.

In one exemplary embodiment, when a thickness direction of the dielectric main body is set to a Z-axis direction and two directions perpendicular to the Z-axis direction are set to an X-axis direction and a Y-axis direction, distribution of gravity center positions of the sealed areas may be concentrated toward the electrode film side than toward the other flat surface side. Although the other flat surface side is in contact with the plasma generation region, the sealed areas are unlikely to be eroded by plasma because the sealed areas are concentrated toward the electrode film side.

Meanwhile, each of the sealed areas is made of a low permittivity material, and thus is deformed by internal stress caused by thermal expansion of the dielectric main body. Therefore, in one exemplary embodiment, the gravity center positions of the sealed areas may be distributed in a plane-symmetric manner with respect to a predetermined XY plane located on the electrode film side. In this case, due to the plane symmetry, a degree of deformation caused by thermal stress is vertically symmetrical with respect to the XY plane, and overall deformation is suppressed. In other words, since the deformation of the dielectric main body is suppressed, the change in the electrostatic capacitance due to heat is small, and the in-plane uniformity of plasma can be further improved.

In one exemplary embodiment, a plasma processing apparatus includes the shower plate described above; a processing chamber accommodating the shower plate; and a radio frequency generator configured to introduce a radio frequency wave for plasma generation into the processing chamber.

When the radio frequency wave is introduced into the processing chamber from the radio frequency generator, plasma is generated in the processing chamber. A processing gas can be supplied into the processing chamber through the gas holes of the shower plate. Accordingly, plasma of the processing gas can be generated and used for processing a target object.

In one exemplary embodiment, a frequency of the radio frequency wave may be in a range from 130 MHz to 220 MHz. This frequency range is included in a very high frequency (VHF) band. The VHF band is a frequency range from about 30 MHz to 300 MHz. Under such conditions, in the case of a general shower plate having a diameter of about 330 mm, a half-wavelength of the radio frequency wave is close to or smaller than the diameter of the shower plate, so that standing waves are likely to be generated. Accordingly, the in-plane uniformity of the plasma tends to deteriorate due to the standing waves. However, with the above-described structure, the high in-plane uniformity can be maintained by the lens effect of the sealed areas.

In one exemplary embodiment, a lower electrode member including: a plate-shaped dielectric main body; and a plurality of sealed areas formed in the dielectric main body. Each of the sealed areas has a permittivity lower than a permittivity of the dielectric main body, and a volume density of the sealed areas at a central region of the dielectric main body is higher than a volume density of the sealed area at a peripheral region of the dielectric main body.

Similarly to the shower plate, in the lower dielectric member, the volume density of the sealed areas, each having a relatively low permittivity, is higher in the central region of the dielectric main body, so that the effective permittivity is decreased. Therefore, the electrostatic capacitance of the central region of the lower dielectric member is smaller than that of the peripheral region of the lower dielectric member. In other words, the lower dielectric member functions as a dielectric lens that corrects the electric field therearound. In the case of generating plasma by introducing a radio frequency wave into the processing chamber, although the plasma intensity tends to be higher in the central region, the electrostatic capacitance is smaller in the central region than in the peripheral region. Therefore, the increase in the plasma intensity is suppressed, and the in-plane uniformity of the plasma is improved.

Hereinafter, the plasma processing apparatus according to the embodiment will be described. Like reference numerals will be given to like parts and redundant description thereof will be omitted.

FIG. 1 shows a configuration of a plasma processing apparatus 100 according to one exemplary embodiment. For the sake of convenience of explanation, a three-dimensional orthogonal coordinate system is set. A vertical direction of the plasma processing apparatus is set to the Z-axis direction, and two directions perpendicular thereto are set to the X-axis direction and the Y-axis direction.

The plasma processing apparatus 100 includes a stage LS at a lower portion thereof. Plasma is generated between the stage LS and an upper electrode 5. The stage LS includes a lower electrode 6 and a temperature controller TEMP (including a heating element) that are embedded in a main body of the stage LS. The stage LS is supported by a driving mechanism DRV and can be moved in the Z-axis direction by the driving mechanism DRV. The driving mechanism DRV is a Zθ stage capable of moving in the Z-axis direction and rotating on the XY plane. The plasma processing apparatus 100 includes the upper electrode 5 and the lower electrode 6 that are opposed to each other in a processing chamber 1, and plasma is generated in a space SP between the upper electrode 5 and the lower electrode 6. A recess is formed at a bottom surface of the upper electrode 5, and a shower plate (a dielectric main body 7 and an upper electrode film 7A) is disposed in the recess. A radio frequency wave introducing unit 9 made of a dielectric material is disposed at a lateral end portion of the space SP.

The dielectric main body 7 of the shower plate has gas holes H for supplying a processing gas from a gas source 10. The dielectric main body 7 has therein a plurality of sealed areas (bubbles or the like). The region including the sealed areas P has a permittivity lower than that of the dielectric main body 7, and an effective permittivity in this region is low.

A cylindrical lid member 3 is disposed at an upper portion of the processing chamber 1. The center of the lid member 3 is opened, and a space between an inner surface of the lid member 3 and an outer surface of the upper electrode 5 forms a radio frequency waveguide 2. The radio frequency wave can be introduced into the waveguide 2 in various manners. For example, a waveguide communicating with the opening of the lid member 3 may be provided, and a radio frequency wave may be supplied into the waveguide. The radio frequency wave introduced into the waveguide 2 propagates downward as indicated by arrows, and is introduced into the processing chamber 1 through the radio frequency wave introducing unit 9 made of a dielectric material. A coaxial tube may be used for propagating the radio frequency wave, and an inner conductor thereof can be connected to the upper electrode 5. In addition, impedance matching can be performed by providing an appropriate dielectric member in a radio frequency wave propagation path.

The radio frequency wave introduced into an upper portion of the waveguide 2 propagates radially toward the peripheral portion along the horizontal direction. Then, the radio frequency wave propagates downward through a waveguide (formed in an annular shape in a plan view and having a depth in the Z-axis direction) extends along an inner side surface of the processing chamber 1. Thereafter, the radio frequency wave is introduced into the radio frequency wave introducing unit 9 and propagates from an outer peripheral portion toward a central portion of the processing chamber 1. The radio frequency wave introducing unit 9 has an annular shape in a plan view when viewed from the Z-axis direction, and the radio frequency wave propagates from all horizontal directions toward an axial center of the processing chamber 1. The radio frequency wave introducing unit 9 is disposed at a lateral end of the plasma generation space SP.

Further, the radio frequency power of the radio frequency wave is introduced into the space between the upper electrode 5 and the stage LS from the side portion of the processing chamber 1. The processing gas is introduced into the processing chamber 1 through the gas holes H of the dielectric main body 7 of the shower plate, and the radio frequency wave is introduced from the radio frequency wave introducing unit 9 into the space between the upper electrode 5 and the lower electrode 6. Accordingly, the processing gas in the processing chamber 1 is turned into plasma. The gas in the processing chamber 1 is exhausted to the outside by a gas exhaust unit 14 through a gas exhaust passage 4.

The upper electrode 5 is a cooling jacket made of a conductive material and has a cooling medium passage 5C. The bottom surface of the upper electrode 5 has a recess, and the shower plate (the dielectric main body 7 and the electrode film 7A) is disposed in the recess.

The electrode film 7A is formed and fixed on the upper surface of the dielectric main body 7 of the shower plate. Further, the electrode film 7A is electrically connected to the bottom surface of the upper electrode 5. The electrode film 7A can be formed by thermal spraying of a metal. However, a method of forming a metal film is not limited to the thermal spraying of a metal, and a molten metal plating method, a molten salt electroplating method, a metallic cementation method, a vapor deposition method, an electrophoresis method, and the like.

The electrode film 7A is preferably a thermally-sprayed metal film. The thermally-sprayed metal film has a high adhesive strength and is not easily peeled off. Therefore, discharge due to peeling off is unlikely to occur, and deterioration of the plasma uniformity is suppressed. Preferably, the metal is aluminum having a high electrical conductivity. For example, the thermal spraying can be performed using the Japanese industrial standard for thermal spray coating of aluminum (JIS H 9301). Before the thermal spraying is performed, roughening such as sandblasting may be performed on a base surface of the dielectric main body 7. In this case, the adhesive strength after the thermal spraying of the metal can be improved.

The radio frequency wave introducing unit 9 is disposed at the lateral end portion (horizontal end portion) of the space SP, and the radio frequency wave is introduced into the space from various lateral directions, so that standing waves are not unlikely to be generated. The dielectric main body 7 of the shower plate functions as a dielectric lens in which the effective permittivity of the central region thereof is lower than that of the peripheral region thereof. Electric field vectors generated between the upper electrode 5 and the lower electrode 6 tend to be sloped outward. Since the dielectric main body 7 of the shower plate functions as the dielectric lens, the directions and the magnitudes of the electric field vectors can be aligned in the vertical direction by refracting the electric field vectors on the plane.

This will be described in detail below.

Figure 2:
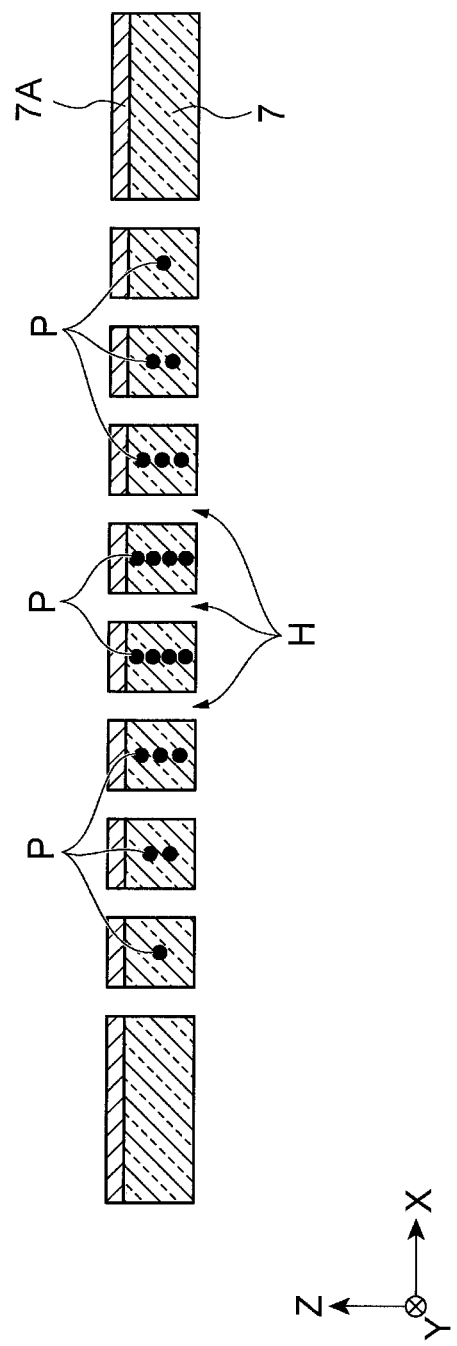
FIG. 2 shows a vertical cross-sectional structure of a shower plate.

FIG. 2 shows a vertical cross-sectional structure of the shower plate.

The shower plate includes the plate-shaped dielectric main body 7 having the gas holes H, and the sealed areas P in the dielectric main body 7. Each of the sealed areas P has a lower permittivity than that of the dielectric main body 7.

The sealed area P is a low permittivity area and is a bubble when it is not filled with a solid. When the sealed area P is a bubble, the pressure at room temperature (300K) is 1 atm or lower. When the pressure at the time of bubble formation is lower than 1 atm, or when the temperature at the time of bubble formation is higher than room temperature, the pressure of the bubble at room temperature can be lower than 1 atm. It is assumed that $\varepsilon r_0$ indicates a relative permittivity (dielectric constant) of vacuum; $\varepsilon r_{N2}$ indicates a relative permittivity of nitrogen gas; $\varepsilon r_{SiO2}$ indicates a relative permittivity of quartz glass ($SiO_2$); $\varepsilon r_{AlN}$ indicates a relative permittivity of aluminum nitride (AlN); and $\varepsilon r_{Al2O3}$ indicates a relative permittivity of alumina ($Al_2O_3$). In this case, the relative permittivities (dielectric constants) at room temperature with respect to the very high frequency (VHF) band satisfy the relationship of "$\varepsilon r_0 < \varepsilon r_{N2} < \varepsilon r_{SiO2} < \varepsilon r_{AlN} < \varepsilon r_{Al2O3}$," so that an appropriate material is selected in this circumstance. When the sealed area P is a bubble of nitrogen gas, the dielectric main body 7 can be made of, e.g., aluminum nitride or alumina. Such a material is advantageous in that it has a high permittivity and high heat resistance.

When the sealed area P is a bubble, the sealed area P preferably can contain at least one gas selected from a group consisting of nitrogen gas and argon gas. It is preferable to use a material that does not affect plasma characteristics even when the dielectric material of the sealed area P is exposed to the outside during the formation or the processing of the gas holes H in the dielectric main body 7. Nitrogen gas and argon gas have a high degree of inactivity and are unlikely to cause contamination. Therefore, higher quality plasma can be generated in the case of using these materials.

Here, a region near an outer periphery of the dielectric main body 7 on the XY plane is defined as a peripheral region. The center of gravity of the dielectric main body 7 on the XY plane is defined as the center, and a region near the center is defined as a central region. Specifically, on the assumption that the dielectric main body 7 has a circular shape on the XY plane and a radius thereof is R, a region from the center to a position of R/2 is set to the central region, and a region from the position of R/2 to a position of R is set to the peripheral region. In this case, a small number of sealed areas P exist in the peripheral region, and a large number of sealed areas P exist in the central region. In other words, the volume density of the sealed areas P in the central region of the dielectric main body 7 is higher than the volume density of the sealed areas P in the peripheral region of the dielectric main body 7. Since the bottom surface of the outermost portion of the peripheral region of the dielectric main body 7 is supported by a member such as the radio frequency wave introducing unit 9 or the like, plasma is not generated directly below the supported region. The above volume density relationship of the sealed areas P is not changed even if the region where plasma is not generated is not included in defining the peripheral region.

Generally, the electrostatic capacitance of the dielectric member is decreased as the effective permittivity is decreased. In the central region of the dielectric main body 7, the volume density of the sealed areas each having a relatively low permittivity is high, so that the effective permittivity is decreased. Therefore, in the case of a capacitor having facing electrodes spaced apart from each other in a thickness direction of the dielectric main body 7, the electrostatic capacitance of the central region is smaller than that of the peripheral region. When plasma is generated by introducing a radio frequency wave from a position above the shower plate or from a vicinity of the shower plate (e.g. from near the side of the shower plate), a plasma intensity tends to be higher in the central region of the shower plate. Since, however, the electrostatic capacitance of the central region is smaller than that of the peripheral region, the increase in the plasma intensity is suppressed and the in-plane uniformity of the plasma is improved.

The plate-shaped dielectric main body 7 shown in FIG. 2 has one flat surface (XY plane located on the positive side of the Z-axis) and the other flat surface (XY plane located on the negative side of the Z-axis). The shower plate has the electrode film 7A fixed onto one surface, and the other surface faces the plasma generation region (the space SP side in FIG. 1). Since the electrode film 7A is fixed onto the dielectric main body 7, the gap therebetween is not affected by a temperature and discharge is unlikely to occur in the gap. Further, since both surfaces of the dielectric main body 7 are flat, the distortion of the dielectric main body 7 due to thermal expansion is suppressed. Therefore, in this structure, the electrostatic capacitance of the shower plate is unlikely to change depending on a temperature, and thus the deterioration of the plasma uniformity due to the temperature change can be suppressed.

The gas holes H have a cylinder shape whose diameter is constant along a depth direction. However, the gas holes H may have a cylindrical shape whose diameter becomes smaller toward the bottom thereof.

Figure 3:
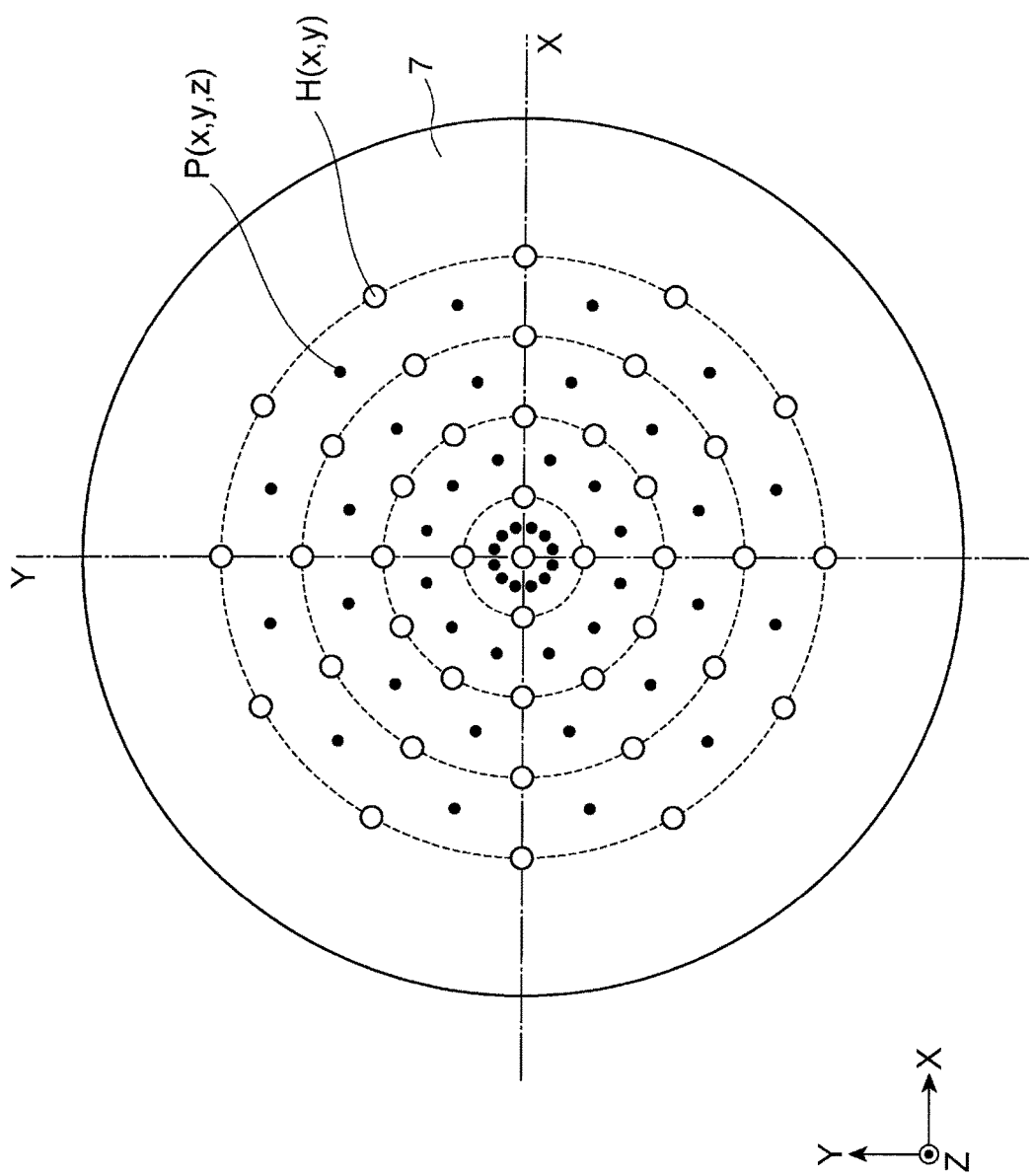
FIG. 3 is a plan view of the shower plate.

FIG. 3 is a plan view of the shower plate viewed from the Z-axis direction.

It is assumed that a three-dimensional position of the center of gravity of each sealed area P is P(x, y, z), and a two-dimensional position of the center of gravity of each gas hole H in the XY plane is H(x, y). The number of the gas holes H in the dielectric main body 7 is smaller than that of the sealed areas P. Since the gas holes H are formed through the dielectric main body 7 along the Z-axis direction, the Z-axis position is not included in the two-dimensional position H(x, y). The center position of the dielectric main body 7 on the XY plane is set to the origin of the XY coordinates, and a vertically upper side is set to a positive side of the Z-axis direction. An equation of a circle having a radius R centered at the origin of the XY coordinates is represented by "$x^2+y^2=R^2$." This equation indicates a position of an outer edge of the dielectric main body 7. In FIG. 3, the gas holes H are arranged on a plurality of concentric circles having different radii. For example, the equations of the circles with four radii (R1<R2<R3<R4) are represented by "$x^2+y^2=R1^2$, $x^2+y^2=R2^2$, $x^2+y^2=R3^2$, and $x^2+y^2=R4^2$," and the positions H(x, y) of the gas holes H satisfy the conditions of these equations. Further, the gas holes H are arranged on radial lines centered at the origin.

The sealed areas P are arranged on a plurality of concentric circles having radii different from those of the gas holes H. For example, the equations of the circles with four radii (r1<r2<r3<r4) are represented by "$x^2+y^2=r1^2$, $x^2+y^2=r2^2$, $x^2+y^2=r3^2$, and $x^2+y^2=r4^2$," and the two-dimensional positions P(x, y) of the sealed areas P satisfy the conditions of these equations, where the radii satisfy "r1<R1<r2<R2<r3<R3<r4<R4." Further, the sealed areas P are arranged on radial lines centered at the origin.

Although the gravity center position z in the Z-axis direction of the sealed area P is a position on the negative side of the Z-axis, most of the sealed areas P are located above a position corresponding to half of a thickness $z_0$ ($z_0/2$) of the dielectric main body 7 in the Z-axis direction. In other words, a gravity center position $z_{total}$ of a group of the entire sealed areas P satisfies a relationship of "$0>z_{total}>z_0/2$." In other words, a distance ($|0-z_{total}|$) from the upper surface (z=0) of the dielectric main body 7 to the gravity center position $z_{total}$ of the group of the entire sealed areas P is smaller than $|z_0/2|$.

In the example of FIG. 3, the diameters of the gas holes H are greater than those of the sealed areas P. The gas holes H have the same diameter, and the sealed areas P have the same diameter. In the example of FIG. 3, the number of the gas holes H per unit area in the central region is greater than that in the peripheral region. Further, the number of the sealed areas P per unit area in the central region is greater than that in the peripheral region. Therefore, even when the sealed areas P have the same depth, the effective permittivity of the central region is smaller than that of the peripheral region. The sealed areas P can be distributed in the depth direction.

In view of a gas flow velocity, in this structure, a gas hole density in the central region is higher than that in the peripheral region, so that a radial gas flow directed from the central region to the peripheral region is generated. When the supply of the processing gas to the gas holes H is stopped during the plasma generation, no gas flow is generated and the processing proceeds in a static state. If the radial gas flow is generated at the time of exhausting the gas in the processing chamber, unnecessary gas in the processing gas is smoothly discharged.

Figure 12:
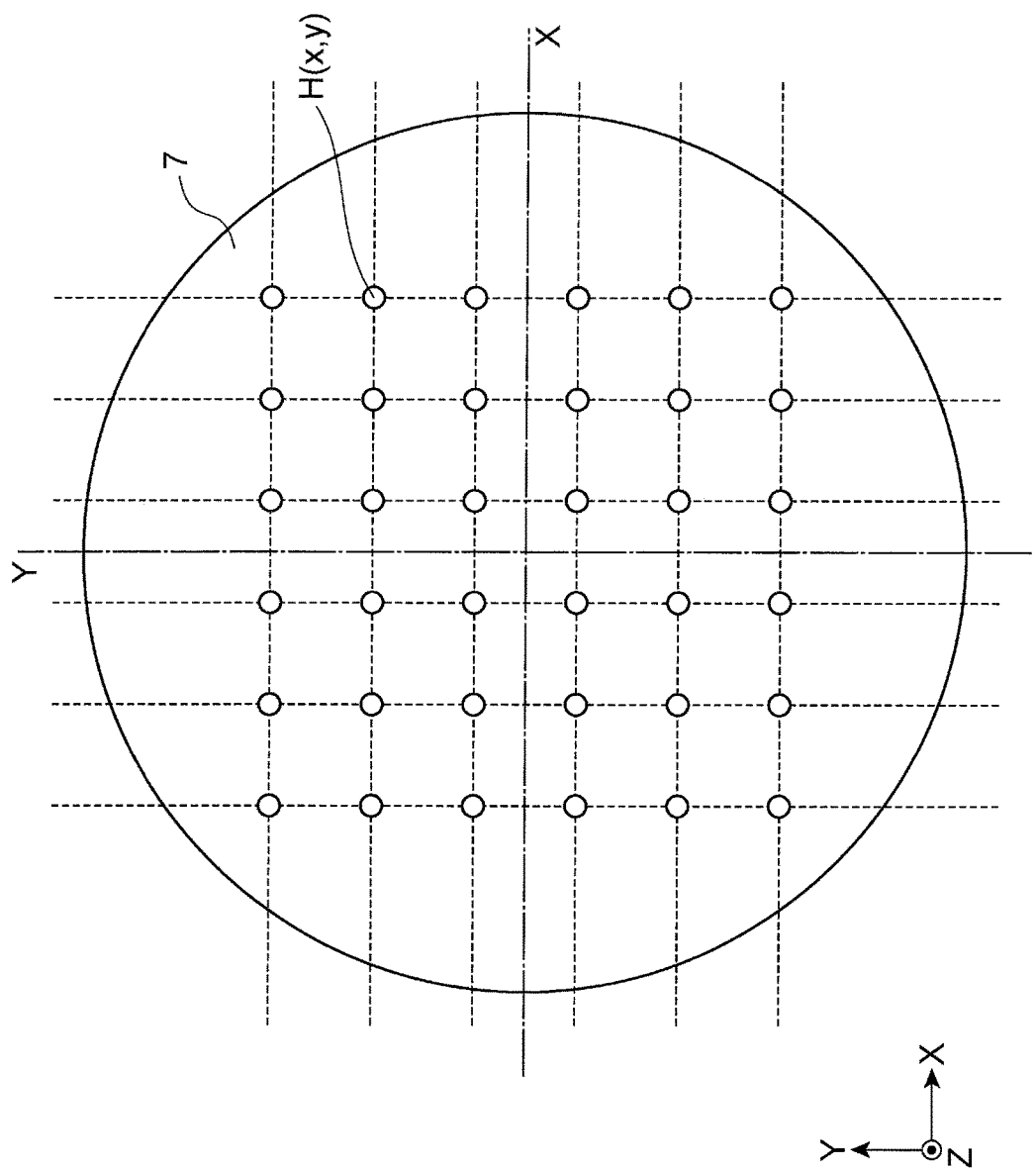
FIG. 12 is a plan view of another example of the shower plate (sealed area not shown)

FIG. 12 is a plan view of another example of the shower plate (sealed areas not shown). As can be seen from FIG. 12, the gas holes H may be arranged on the lattice points of a square lattice. In FIG. 12, the gas holes H are not arranged near the edges of the peripheral region in FIG. 12. However, the gas holes H may be arranged near the edges. In the example of FIG. 12, although the radial gas flow is not generated unlike the example of FIG. 3, the gas can be introduced into the processing chamber with uniform distribution if a gas introducing pressure is uniform on the plane. Further, although the sealed areas P are not illustrated in FIG. 12, various types of sealed areas P can be arranged in the dielectric main body 7 of FIG. 12.

Referring back to FIG. 3, the permittivity will be described. No solid exists inside the gas holes H, and the gas holes H have permittivities lower than that of the dielectric main body 7. Therefore, the effective permittivity per unit area on the XY plane is decreased as the two-dimensional density of the gas holes H is increased. If the two-dimensional density of the gas holes H in the central region is increased and the three-dimensional density of the sealed areas P in the central region is also increased, a desired permittivity can be realized with a smaller number of sealed areas P.

Next, a specific structure of the sealed areas P will be described.

FIG. 4 shows a vertical cross-sectional structure of the dielectric main body of the shower plate.

Each sealed area P has a spherical shape. The "sphere" is circular both in a cross section including the Z-axis (XZ cross section) and in a XY cross section. The sealed areas P are distributed in the dielectric main body 7. The number of the sealed areas P in the Z-axis direction in the central region is greater than the number of the sealed areas P in the Z-axis direction in the peripheral region. The number of the sealed areas P decreases as the distance from the center increases. A group of the sealed areas P is disposed near an upper portion of the dielectric main body 7. In other words, a lowermost sealed area P in the Z-axis direction is disposed above a lower limit position ($z=z_{down}$) of the dielectric main body 7. Further, an uppermost sealed area P in the Z-axis direction is disposed below an upper limit position ($z=z_{up}$) of the dielectric main body 7. A thickness of the dielectric main body 7 in the Z-axis direction is $|z_0|$, and the lower limit position $|z_{down}|$ is set to satisfy a protection thickness "$\Delta Z_M = |z_0 - z_{down}|$." The distribution of the gravity center positions of the sealed areas P is concentrated toward the electrode film side (upper surface side of the dielectric main body 7) than toward the other surface side (bottom surface side of the dielectric main body 7). Although the bottom surface side is in contact with the plasma generation region, the sealed areas P are unlikely to be eroded by the plasma because they are disposed on one side toward the upper surface side.

The protection thickness $\Delta Z_M$ is a thickness that is ensured to protect the sealed areas P from the plasma generated on the bottom surface of the dielectric main body 7. The protection thickness $\Delta Z_M$ is set because the bottom surface of the dielectric main body 7 is eroded by the plasma as time elapses. If the protection thickness $\Delta Z_M$ is too thin, the protection function is not effective. On the other hand, if the protection thickness $\Delta Z_M$ is too thick, a useless area is increased. Therefore, it is preferable to satisfy a condition of "$z1 \leq \Delta ZM \leq z2$." A desired z1 is $|z0 \times 5\%|$, $|z0 \times 10\%|$, $|z0 \times 15\%|$, or $|z0 \times 20\%|$. A desired z2 is $|z0 \times 50\%|$, $|z0 \times 45\%|$, $|z0 \times 40\%|$, or $|z0 \times 35\%|$.

The upper limit position of the sealed areas P is set such that the sealed areas P are not exposed. Since the upper surface of the dielectric main body 7 is not etched by plasma, the upper limit position is set to satisfy a condition of "$|z_{up}| < \Delta Z_M$."

A material having a low permittivity such as a gas or the like has a low refractive index and tends to have low intermolecular bond strength and a low density, compared to a solid dielectric material such as alumina, aluminum nitride, or the like. Such a material is easily deformed. Each sealed area P is made of a low permittivity material, and thus is deformed by internal stress caused by thermal expansion of the dielectric main body 7.

Therefore, the gravity center positions of the sealed areas P are distributed in a plane-symmetric manner with respect to a predetermined XY plane ($z=z_{center}$) located on the electrode film side. In this case, due to the plane symmetry, a degree of deformation caused by thermal stress becomes vertically symmetrical with respect to the XY plane, and overall deformation is suppressed. In other words, since the deformation of the dielectric main body 7 is suppressed, the change in the electrostatic capacitance due to heat is small, and the in-plane uniformity of plasma can be further improved. Further, the conditions of "$|z_{center}| = |z_{up}| + |z_{down} - z_{up}|/2$" and "$|z_{center}| < |z_0/2|$" are satisfied.

By increasing a density of the sealed areas in the central region of the dielectric main body, the permittivity distribution is set to be effectively equivalent to that of a convex dielectric plate having a thick central region. A Gaussian function or the like can be used as the two-dimensional function on a plane including a convex shape in the Z-axis. Generally, an electrostatic capacitance C of a capacitor satisfies "$C=\varepsilon S/d$ ($\varepsilon$ being permittivity, S being an area of overlap of two facing electrodes that make up the capacitor, and d being a distance between the two facing electrodes)." Therefore, on the assumption that capacitor electrodes are disposed on the upper surface and the bottom surface of the dielectric main body 7, in the case of a convex dielectric plate, the distance d in the central region is large and, thus, the electrostatic capacitance C becomes small. For example, the above-described two-dimensional function corresponds to a value of d, and a value of 1/d used for calculating C changes depending on locations. Here, by changing the permittivity $\varepsilon$ instead of changing 1/d to be equivalent to the convex dielectric plate, an effect equivalent to that of the convex dielectric plate can be obtained even with a flat dielectric plate. The permittivity $\varepsilon$ of the mixture of the dielectric main body 7 and the sealed areas P can be calculated using the Maxwell-Garnett model.

Figure 5C:
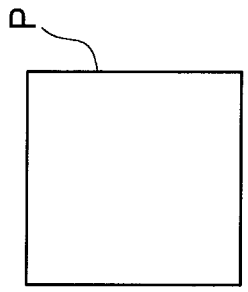
FIGS. 5A to 5C show horizontal cross-sectional shapes (shapes on an XY plane) of a sealed area.
Figure 5B:
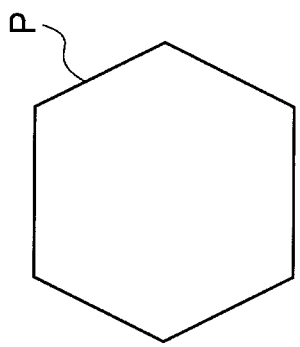
Figure 5A:
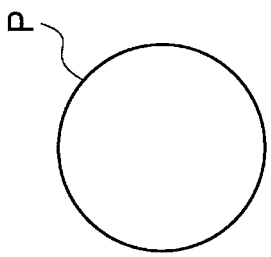

FIGS. 5A to 5C show horizontal cross-sectional shapes (shapes on the XY plane) of the sealed area.

As shown in FIGS. 5A to 5C, the horizontal cross-sectional shape of the sealed area may be a circle (FIG. 5A), a regular hexagon (FIG. 5B), a square (FIG. 5C), or the like. Among polygons, a circle, a regular hexagon, and a square have rotational symmetry and can realize highly uniform distribution of the permittivity even when they are arranged in various directions. Accordingly, it is easy to obtain uniform plasma distribution.

FIGS. 6A to 6C show vertical cross-sectional shapes (shapes in the XZ plane) of the sealed area.

As shown in FIGS. 6A to 6C, the vertical cross-sectional shape of the sealed area P may be a circle (FIG. 6A), an ellipse (FIG. 6B), a rectangle (FIG. 6C), or the like. In the case of the sealed area P having a large longitudinal dimension (such as an ellipse), an effect equivalent to that of a shape in which multiple circles are continuously stacked can be obtained, and a percentage of a low permittivity material per unit volume can be increased compared to the case of a circular shape (sphere). Further, since a circle or an ellipse has no sharp corner, electric field concentration at a corner is unlikely to occur and the resistance to an electric field is improved.

FIG. 7 shows a vertical cross-sectional structure of another example of the dielectric main body of the shower plate.

In this example, each sealed area P has a shape extending along the thickness direction of the dielectric main body 7 (see FIG. 6B). The length of the sealed area P in the Z-axis direction in the central region is longer than that in the peripheral region, and the electrostatic capacitance in the thickness direction of the shower plate is decreased in the central region. When the sealed area P having a low permittivity extends along the thickness direction (longitudinal direction), the electrostatic capacitance between the upper surface and the bottom surface of the dielectric main body 7 of the shower plate can be sufficiently reduced.

Specifically, each sealed area P has an elliptical vertical cross-sectional shape. Further, each sealed area P has a circular horizontal cross-sectional shape, but may also have other shapes. The sealed areas P are distributed in the dielectric main body 7. The length of the sealed area P in the Z-axis direction in the central region is longer than the length of the sealed area P in the Z-axis direction in the peripheral region such that the length of the sealed area P is decreased as a distance from the center is increased. The group of the sealed areas P is arranged near the upper portion of the dielectric main body 7. In other words, the lowermost sealed area P in the Z-axis direction is located above the lower limit position "$z=z_{down}$." Further, the uppermost sealed area P in the Z-axis direction is located below the upper limit position "$z=z_{up}$." The thickness of the dielectric main body 7 in the Z-axis direction is $|z0|$, and the lower limit position $|z_{down}|$ is set to satisfy the protective thickness "$\Delta Z_M = |z_0 - z_{down}|$." The distribution of the gravity center positions of the sealed areas P is concentrated toward the electrode film side (upper surface side of the dielectric main body 7) than toward the other surface side (bottom surface side of the dielectric main body 7). Although the bottom surface side is in contact with the plasma generation region, the sealed areas P are unlikely to be eroded by the plasma because they are disposed on one side toward the upper surface side.

The setting range of the protection thickness $\Delta Z_M$ is the same as that described above. Since the upper surface of the dielectric main body 7 is not eroded by plasma, the protection thickness $\Delta Z_M$ is set to satisfy a condition of "$|z_{up}| < \Delta Z_M$."

In order to suppress the deformation caused by thermal expansion, the gravity center positions of the sealed areas P are distributed on a predetermined XY plane ($z=z_{center}$) located on the electrode film side, and the shapes of the upper sealed areas P and the lower sealed areas P divided by the XY plane ($z=z_{center}$) are symmetrical with respect to the XY plane. In this case, due to the plane symmetry, a degree of deformation caused by thermal stress is vertically symmetrical with respect to the XY plane, and overall deformation is suppressed. In other words, since the deformation of the dielectric main body 7 is suppressed, the change in the electrostatic capacitance due to heat is small, and the in-plane uniformity of plasma can be further improved. Further, the conditions of "$|z_{center}| = |z_{up} + z_{down} - z_{up}|/2$" and "$|z_{center}| < z_0/2|$" are satisfied.

Figure 8:
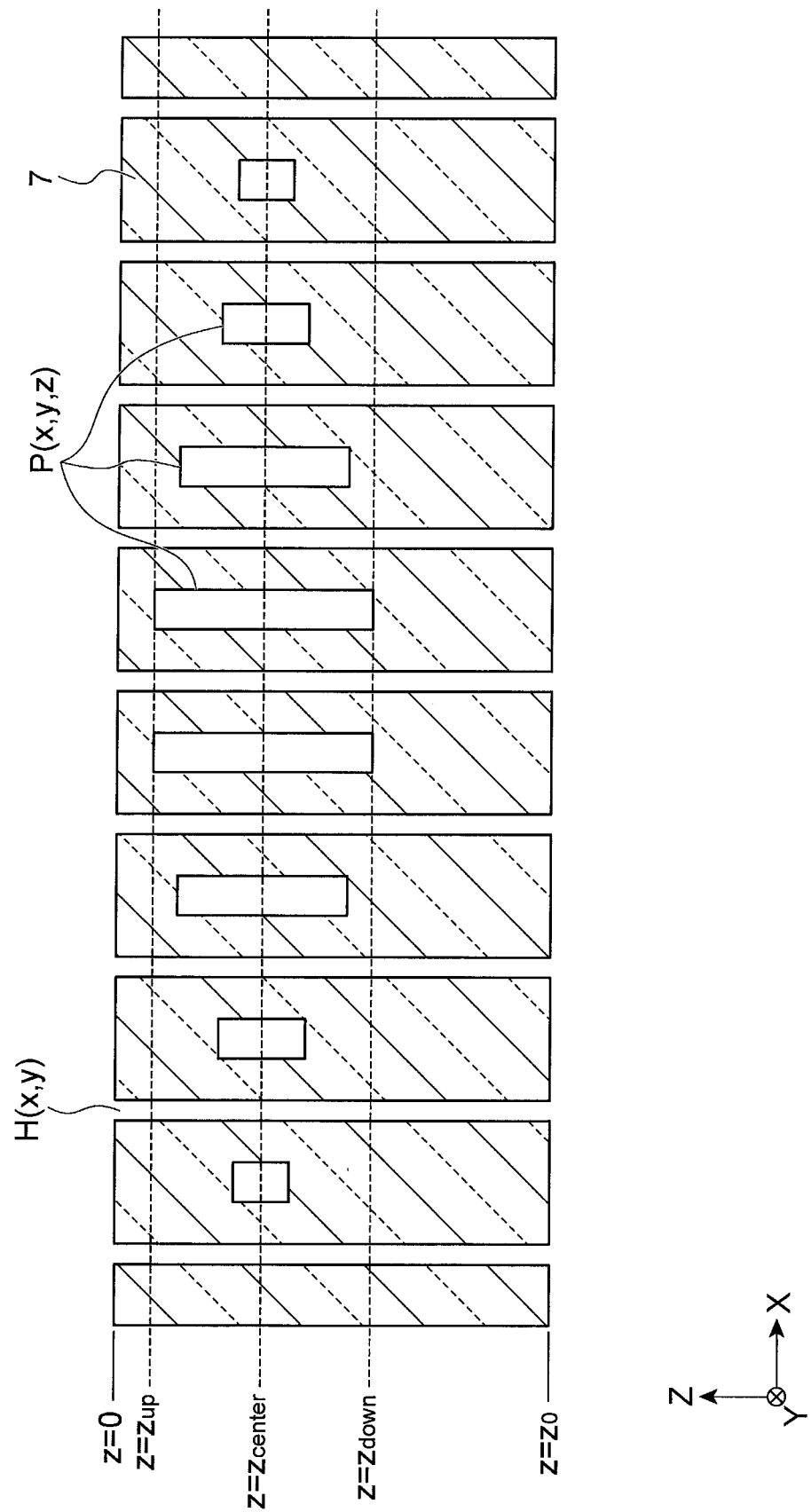

FIG. 8 shows a vertical cross-sectional structure of still another example of the dielectric main body of the shower plate.

A structure shown in FIG. 8 is the same as that shown in FIG. 7 except that each sealed area P has a rectangular vertical cross-sectional shape. Further, each sealed area P has, e.g., a circular horizontal cross-sectional shape, but may also have other shapes. The sealed areas P are distributed in the dielectric main body 7. Since the shape of each sealed area P is a cylinder or a polygonal column, the dimensions of the upper surface and the bottom surface can be precisely controlled.

Figure 9:
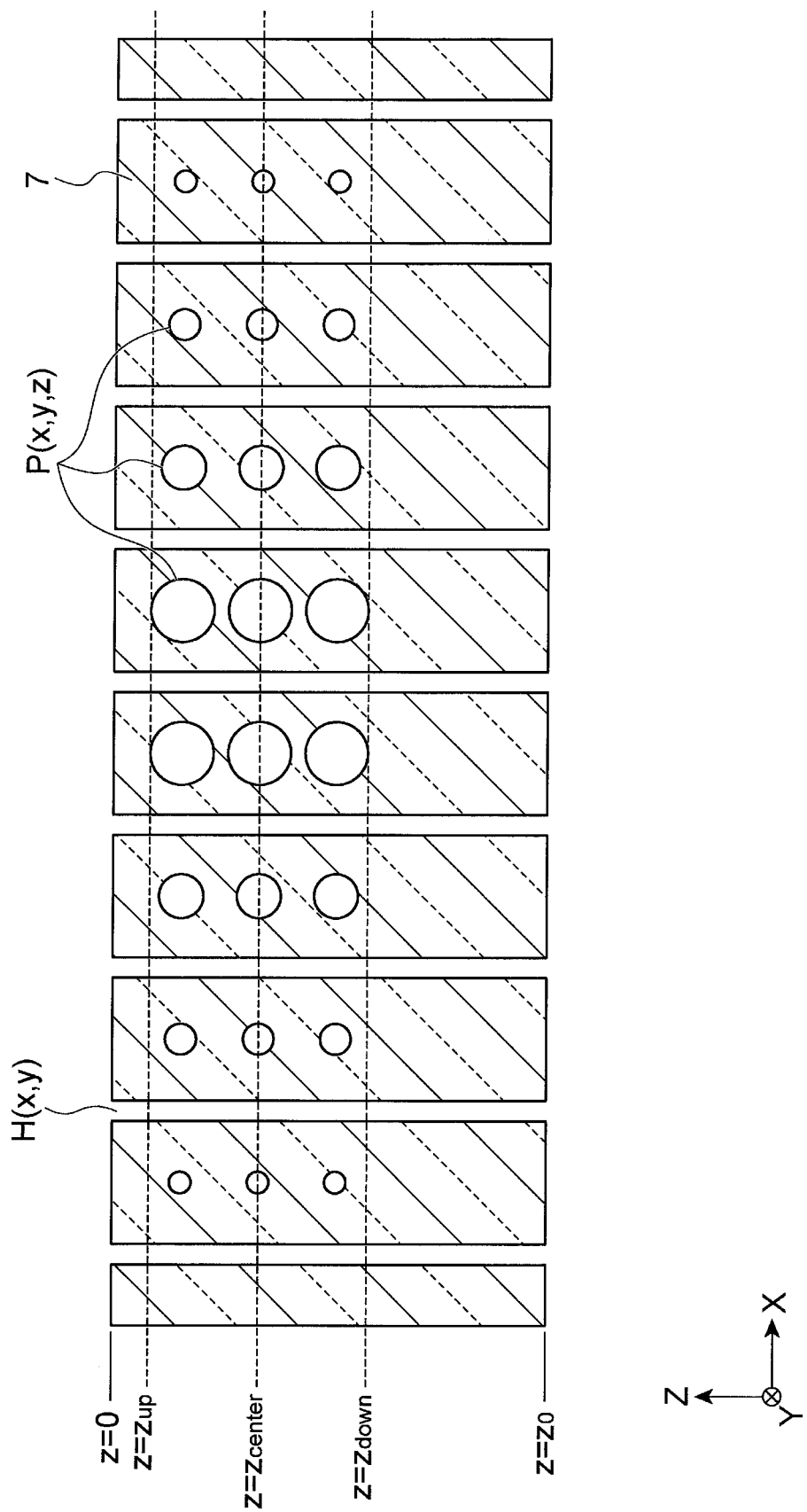

FIG. 9 shows a vertical cross-sectional structure of still another example of the dielectric main body of the shower plate.

A structure shown in FIG. 9 is the same as that shown in FIG. 4 except that the sealed areas P closer to the central region in the XY plane have a larger diameter and the number of the sealed areas P aligned in the Z-axis direction is the same. As a modified example of FIG. 9, a structure in which the sealed areas P closer to the center ($z=z_{center}$) of XY plane in the Z-axis direction have a larger diameter may be considered. In any case, the sealed areas P are distributed in a plane-symmetric manner with respect to the XY plane having $z_{center}$.

Figure 10:
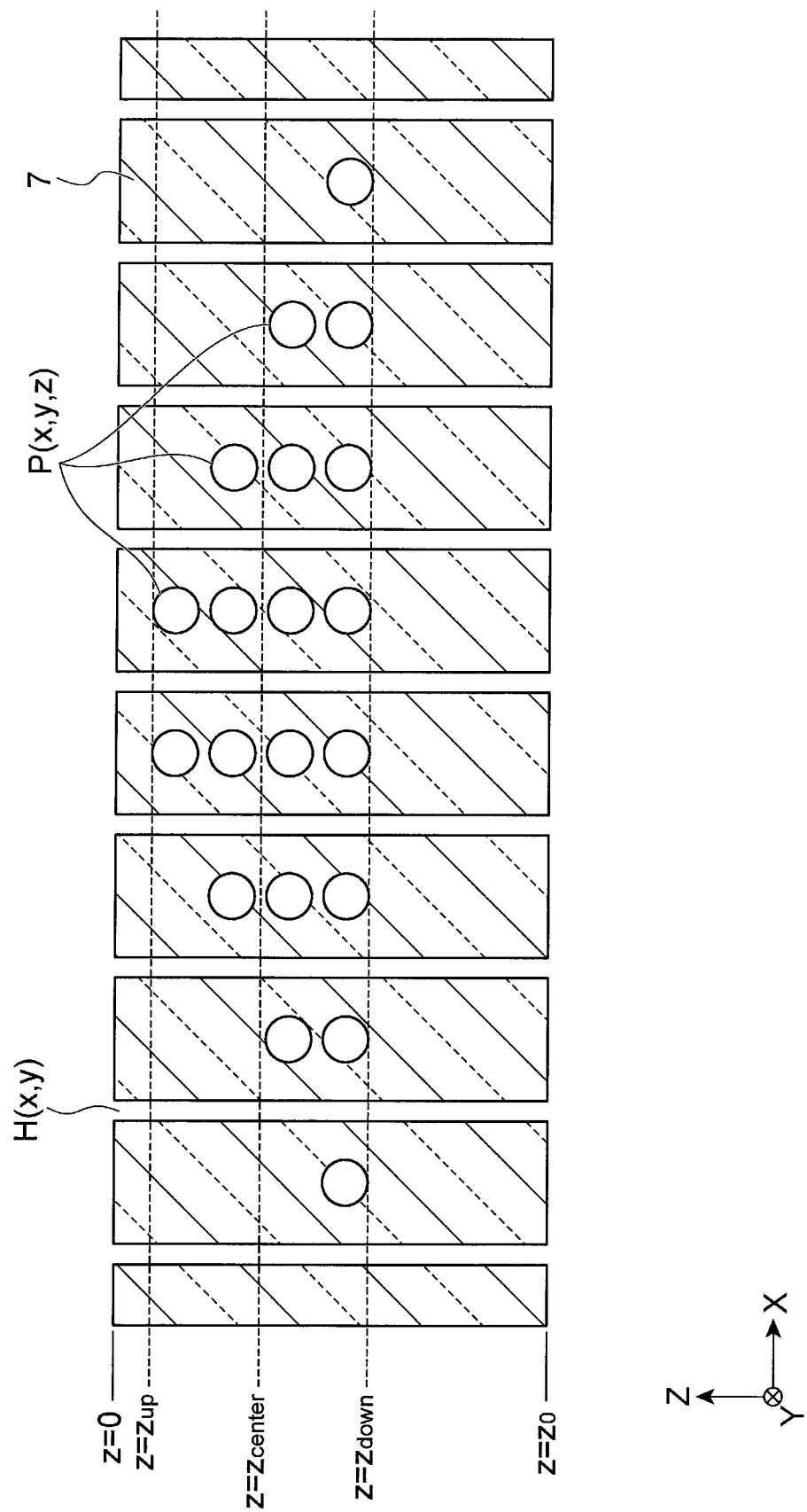

FIG. 10 shows a vertical cross-sectional structure of still another example of the dielectric main body of the shower plate.

In this example, the group of the sealed areas P in FIG. 4 is shifted toward the bottom surface side, and the sealed areas P are distributed in a convex shape as a whole. Even with this structure, the permittivity distribution in the horizontal direction can be controlled.

Figure 11:
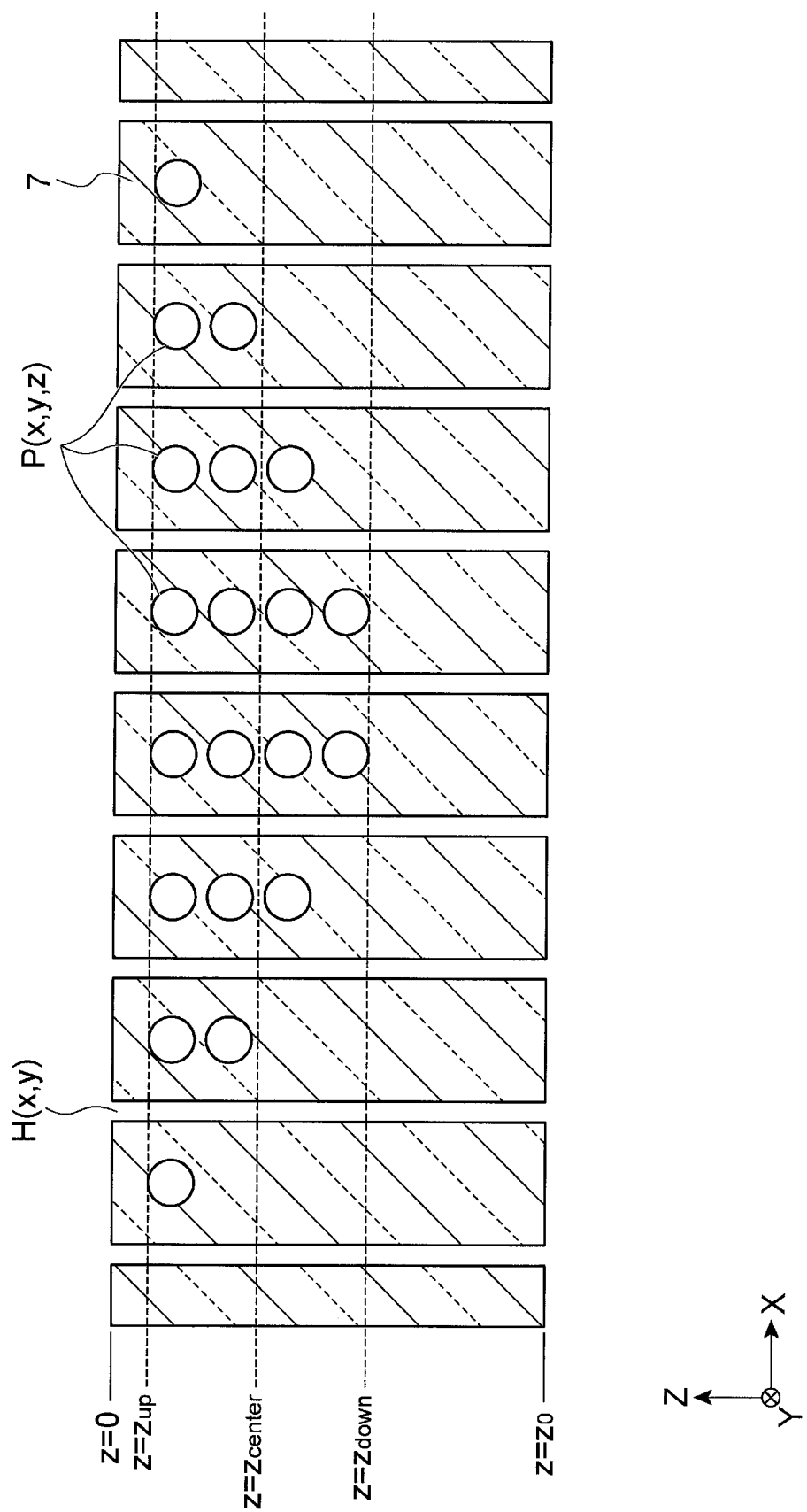

FIG. 11 shows a vertical cross-sectional structure of still another example of the dielectric main body of the shower plate.

In this example, the distribution of the group of the sealed areas P is obtained by inverting the distribution of the group of the sealed areas P in FIG. 10. Even with this structure, the permittivity distribution in the horizontal direction can be controlled.

Figure 13:
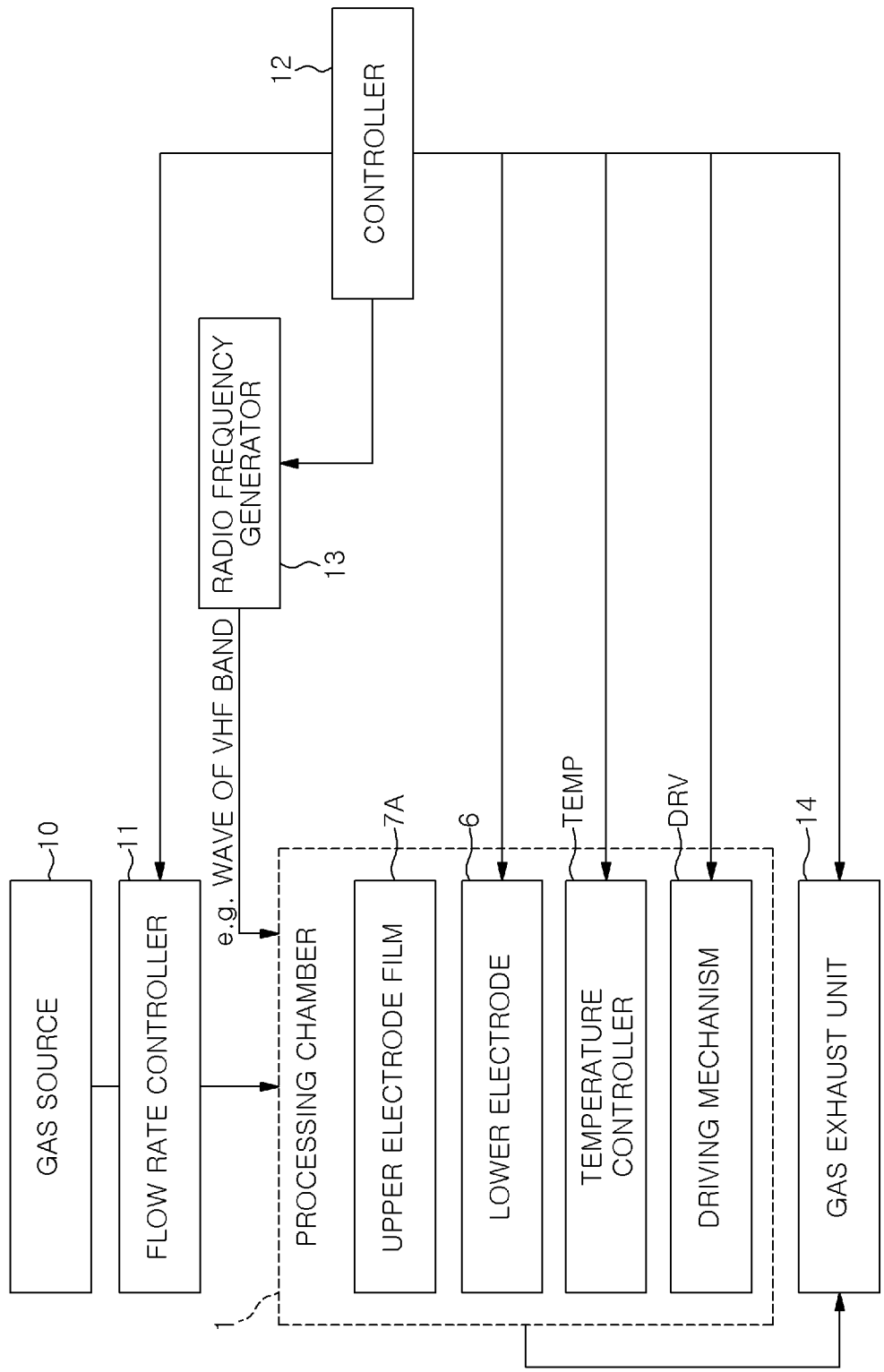
FIG. 13 shows a system configuration of the plasma processing apparatus.

FIG. 13 shows a system configuration of the plasma processing apparatus 100.

The plasma processing apparatus includes the above-mentioned shower plate (the dielectric main body 7 and the upper electrode film 7A), the processing chamber 1 that accommodates the shower plate, and the radio frequency generator 13 for introducing a radio frequency wave for plasma generation into the processing chamber 1. When the radio frequency wave is introduced into the processing chamber 1 from the radio frequency generator 13, plasma is generated in the processing chamber 1. A processing gas can be supplied into the processing chamber 1 through the gas holes of the shower plate. Accordingly, plasma of the processing gas can be generated and used for processing a target object.

A desired frequency of the radio frequency wave in this example is within a range from 130 MHz to 220 MHz. This frequency range is included in a very high frequency (VHF) band. The VHF band is a frequency range from about 30 MHz to 300 MHz. Under such conditions, in the case of a general shower plate having a diameter of about 330 mm, a half-wavelength of the radio frequency wave is close to or smaller than the diameter of the shower plate, so that standing waves are likely to be generated. Accordingly, the in-plane uniformity of the plasma tends to deteriorate due to the standing waves. However, with the above-described structure, the lens effect is clearly realized by the sealed areas P.

The desired frequency will be described further. For example, if the relative permittivity of $Al_2O_3$ forming the dielectric main body is 9, a wavelength shortening rate is "$1/\sqrt{9}=1/3$" and a wavelength of 130 MHz becomes ⅓ of a wavelength in a vacuum. Therefore, the wavelength in $Al_2O_3$ is calculated as follows: "2.3 m×⅓=0.77 m." A half-wavelength thereof is "0.385 m=385 mm," which is close to 330 mm, i.e., the diameter of the shower plate. In this case, the effect of the distribution of the sealed areas P can be increased. Further, the dielectric main body 7 may be made of $Al_2O_3$, AlN, $Y_2O_3$, or the like. Further, it is preferred that the shower plate has a smaller dielectric loss tangent. When the sealed areas P are bubbles, it is advantageous in that there is basically no loss. It is also possible to use polymer composite powder as a powder material for the sealed areas P.

The substrate that is a target object is, e.g., a wafer, and is placed on the stage LS (see FIG. 1). The stage LS can be moved vertically by the driving mechanism DRV. Accordingly, the distance between the target substrate W (wafer) on the stage LS and plasma can be set to an optimal distance. In other words, the plasma distribution state can be changed by moving the position of the stage LS and the in-plane uniformity of the plasma can be improved by moving the stage such that the plasma can be uniformly and stably generated.

The temperature controller TEMP includes a medium passage through which a cooling medium flows, a heating element (heater), and a temperature sensor. The stage LS (see FIG. 1) is controlled by the controller 12 to have a target temperature. For example, when the target temperature is T1° C., if the output of the temperature sensor is lower than T1° C., the heater is heated. If the output of the temperature sensor is higher than T1° C., the heater is not heated and the cooling medium is allowed to flow through the medium passage. Here, the heating element of the temperature controller TEMP is preferably embedded in the stage LS (see FIG. 1), and may be made of a material such as a high melting point metal, carbon, or the like. Further, a power feed line is connected to the heating element.

The controller 12 also controls the gas exhaust unit 14. The gas exhaust unit 14 exhausts a gas in the processing chamber 1 to the outside through the gas exhaust passage 4 (see FIG. 1). Accordingly, the gas in the plasma generation space SP (see FIG. 1) can be exhausted, and the pressure in the plasma generation space SP can be set to an appropriate pressure level. The pressure may be changed depending on the processing content and can be set to, e.g., 0.1 Pa to 100 Pa. As an example of the gas exhaust unit 14, a pump that is generally used in a vacuum system, such as a rotary pump, an ion pump, a cryostat, or a turbo molecular pump can be used.

The controller 12 controls a flow rate controller 11 for controlling a flow rate of the gas from a gas source 10. The flow rate controller 11 may be a simple valve. Accordingly, a target gas can be introduced into the processing chamber 1. The controller 12 also controls the radio frequency generator 13. In this example, the radio frequency wave preferably has a frequency in a VHF band (about 30 MHz to 300 MHz). However, other frequency bands can also be used.

As an example of a gas of the gas source 10 may be, in addition to a noble gas such as Ar or the like, a gas containing carbon and fluorine such as $CF_4$, $C_4F_8$, or the like, and a gas of, e.g., $SiH_4$, $N_2$, $O_2$, or the like. The plasma processing such as etching or the like can be performed, in addition to the film deposition, depending on types of processing gases. In the case of using the VHF band, a quality of a film made of $SiO_2$ (formed by applying $SiH_4$ and oxygen plasma) or the like, in addition to silicon nitride (formed by applying $SiH_4$ and plasma of nitrogen or plasma of $NH_3$), is considerably improved. A gas can be introduced in various manners. For example, a through-hole can be formed in the upper electrode 5 (see FIG. 1) along the Z-axis direction to allow a gas to reach the shower plate therethrough. The shower plate can improve the in-plane uniformity of gas concentration.

The upper electrode film 7A, the upper electrode 5 (see FIG. 1), and the lower electrode 6 can be made of aluminum. The stage LS can be made of ceramic, e.g., aluminum nitride (AlN). AlN is advantageous in that it has high heat resistance and high plasma resistance. A dielectric member such as quartz or the like can be embedded in the waveguide 2 (see FIG. 1). However, a gas such as air or nitrogen may be embedded as long as the radio frequency wave can propagate therethrough.

The substrate placed on the stage LS (see FIG. 1) may be made of silicon or the like, and the processing such as film formation, etching, or the like can be performed on the substrate. If necessary, an electrostatic chuck may be provided, or a DC bias potential for attracting ions to the lower electrode 6 may be added. In some cases, a radio frequency potential may be applied to the lower electrode 6. In addition, a magnet may be disposed around the processing chamber 1.

Figure 14:
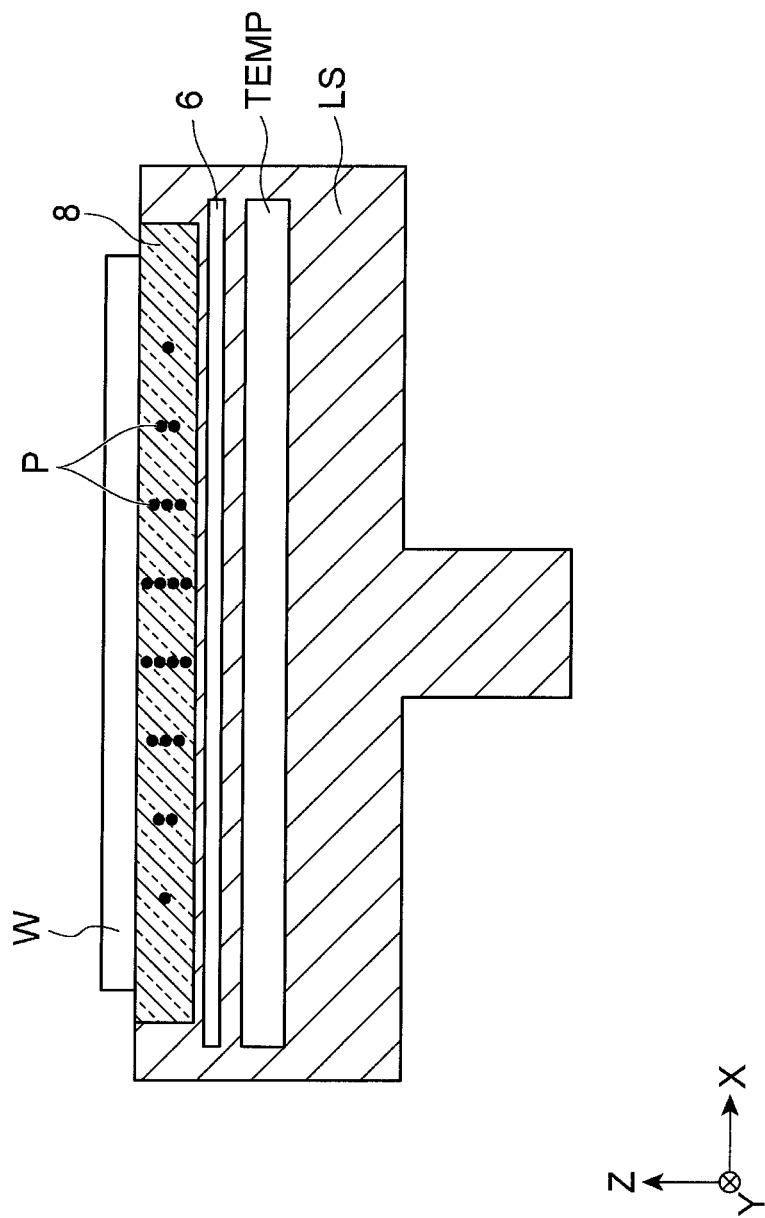
FIG. 14 shows a vertical cross-sectional configuration of a stage including a lower dielectric member (dielectric lens for stage).

FIG. 14 shows a vertical cross-sectional configuration of a stage having a lower dielectric member (dielectric lens for stage).

The lower dielectric member includes a plate-shaped dielectric main body 8 and sealed areas P formed in the dielectric main body 8. Each of the sealed areas P has a permittivity lower than that of the dielectric main body 8. The volume density of the sealed areas P in the central region of the dielectric main body 8 is higher than that of the sealed areas P in the peripheral region of the dielectric main body 8. The structure of the lower dielectric member is the same as that of the above-described shower plate except that the thermally-sprayed electrode film is not provided. Therefore, the dielectric main body 8 can be substituted for the dielectric main body 7 in the above description.

Similar to the shower plate, in the lower dielectric member, the volume density of the sealed areas P each having a relatively low permittivity is higher in the central region of the dielectric main body 8, so that the effective permittivity is decreased. Therefore, the electrostatic capacitance of the central region of the lower dielectric member is smaller than that of the peripheral region of the lower dielectric member. In other words, the lower dielectric member functions as a dielectric lens that corrects the electric field generated by radio frequency plasma. In the case of generating plasma by introducing the radio frequency wave from near the side of the processing chamber, although the plasma intensity tends to be higher in the central region, the electrostatic capacitance is smaller in the central region than in the peripheral region. Therefore, the increase in the plasma intensity is suppressed, and the in-plane uniformity of the plasma is improved.

The dielectric main body or the lower dielectric member can be manufactured by sintering ceramic powder. The ceramic powder can be processed into any shape using a 3D printer. Generally, when ceramic powder contained in a liquid such as water or an organic solvent is injected from a tip end of a nozzle of the 3D printer, the ceramic powder is positioned at an injection position. Although it is possible to perform sintering after the entire shape is formed, it is also possible to perform sintering by heating using laser beam or electron beam while injecting a ceramic material.

Further, powder bed fusion (PBF), directed energy deposition (DED), binder jetting, or the like is known as an example of a modeling technique.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:
1. A shower plate comprising:
a plate-shaped dielectric main body having gas holes;
a plurality of sealed areas formed in the dielectric main body; and
an electrode film fixed onto one flat surface of the dielectric main body,
wherein each of the sealed areas has a permittivity lower than a permittivity of the dielectric main body, and a volume density of the sealed areas at a central region of the dielectric main body is higher than a volume density of the sealed areas at a peripheral region of the dielectric main body, wherein when a thickness direction of the dielectric main body is set to a Z-axis direction and two directions perpendicular to the Z-axis direction are set to a X-axis direction and a Y-axis direction, distribution of respective gravity center positions of the sealed areas is concentrated toward a side where the electrode film is provided than toward a side where said the other flat surface is provided, and wherein the plurality of sealed areas are symmetrically disposed within the dielectric main body with respect to a predetermined XY plane.

2. The shower plate of claim 1, further comprising an electrode film, wherein the plate-shaped dielectric main body has the one flat surface and the other flat surface, and said the other flat surface faces a plasma generation region.

3. The shower plate of claim 2, wherein the electrode film is a thermally-sprayed metal film.

4. The shower plate of claim 1, wherein each of the sealed areas contains at least one gas selected from a group consisting of nitrogen gas and argon gas.

5. The shower plate of claim 2, wherein each of the sealed areas contains at least one gas selected from a group consisting of nitrogen gas and argon gas.

6. The shower plate of claim 1, wherein each of the sealed areas has a shape extending along a thickness direction of the dielectric main body.

7. The shower plate of claim 2, wherein each of the sealed areas has a shape extending along a thickness direction of the dielectric main body.

8. A plasma processing apparatus comprising:
the shower plate described in claim 1;
a processing chamber accommodating the shower plate; and
a radio frequency generator configured to introduce a radio frequency wave for plasma generation into the processing chamber.

9. The plasma processing apparatus of claim 8, wherein a frequency of the radio frequency wave is in a range from 130 MHz to 220 MHz.

* * * * *